(12) United States Patent
Asai et al.

(10) Patent No.: US 11,553,592 B2
(45) Date of Patent: *Jan. 10, 2023

(54) CERAMIC SUBSTRATE AND ELECTRONIC COMPONENT-EMBEDDED MODULE

(71) Applicant: Murata Manufacturing Co., Ltd., Kyoto (JP)

(72) Inventors: Ryota Asai, Kyoto (JP); Yosuke Matsushita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/307,300

(22) Filed: May 4, 2021

(65) Prior Publication Data
US 2021/0259105 A1 Aug. 19, 2021

Related U.S. Application Data

(63) Continuation of application No. 16/281,269, filed on Feb. 21, 2019, now Pat. No. 11,246,215, which is a
(Continued)

(30) Foreign Application Priority Data
Aug. 22, 2016 (JP) .............................. JP2016-161717

(51) Int. Cl.
*H05K 1/11* (2006.01)
*H05K 1/03* (2006.01)
(Continued)

(52) U.S. Cl.
CPC .......... *H05K 1/111* (2013.01); *H01L 21/4853* (2013.01); *H01L 21/56* (2013.01);
(Continued)

(58) Field of Classification Search
CPC ........ H05K 1/111; H05K 1/03; H05K 1/0306; H05K 1/181; H05K 3/0044; H05K 3/38;
(Continued)

(56) References Cited

U.S. PATENT DOCUMENTS 5,855,711 A * 1/1999 Araki ................ H01L 23/49894
257/E23.173
6,228,196 B1 5/2001 Sakamoto et al.
(Continued)

FOREIGN PATENT DOCUMENTS

JP H04-70775 B2 11/1992
JP H10-75025 A 3/1998
(Continued)

OTHER PUBLICATIONS

International Search Report for PCT/JP2017/027723 dated Oct. 24, 2017.
(Continued)

*Primary Examiner* — Ishwarbhai B Patel
(74) *Attorney, Agent, or Firm* — Pearne & Gordon LLP

(57) ABSTRACT

A ceramic substrate of the present disclosure is a ceramic substrate including a ceramic body having a ceramic layer on a surface thereof and a surface electrode placed on a primary face of the ceramic body. Between the surface electrode and the ceramic layer is an oxide layer made of an insulating oxide having a melting point higher than the firing temperature for the ceramic layer. The oxide layer also extends on the ceramic layer not occupied by the surface electrode. The oxide layer on the ceramic layer not occupied by the surface electrode has a rough surface.

3 Claims, 5 Drawing Sheets

Related U.S. Application Data continuation of application No. PCT/JP2017/027723, filed on Jul. 31, 2017.

(51) Int. Cl.

| | |
|---|---|
| *H05K 1/18* | (2006.01) |
| *H01L 25/00* | (2006.01) |
| *H05K 3/38* | (2006.01) |
| *H01L 21/56* | (2006.01) |
| *H05K 3/46* | (2006.01) |
| *H01L 21/48* | (2006.01) |
| *H01L 23/31* | (2006.01) |
| *H01L 23/498* | (2006.01) |
| *H05K 3/00* | (2006.01) |
| *H05K 3/40* | (2006.01) |
| *H05K 5/06* | (2006.01) |
| *H01L 23/29* | (2006.01) |
| *H01L 23/15* | (2006.01) |

(52) U.S. Cl.
CPC .... *H01L 23/3121* (2013.01); *H01L 23/49811* (2013.01); *H01L 23/49894* (2013.01); *H01L 25/00* (2013.01); *H05K 1/03* (2013.01); *H05K 1/0306* (2013.01); *H05K 1/181* (2013.01); *H05K 3/0044* (2013.01); *H05K 3/38* (2013.01); *H05K 3/381* (2013.01); *H05K 3/4007* (2013.01); *H05K 3/46* (2013.01); *H05K 5/065* (2013.01); *H01L 23/15* (2013.01); *H01L 23/293* (2013.01)

(58) Field of Classification Search
CPC ........ H05K 3/381; H05K 3/4007; H05K 3/46; H05K 5/065; H05K 3/388; H05K 3/284; H01L 21/4853; H01L 21/56; H01L 23/3121; H01L 23/49811; H01L 23/49894; H01L 25/00; H01L 23/15; H01L 23/293; Y02P 70/50

See application file for complete search history.

(56) References Cited

U.S. PATENT DOCUMENTS

| | | |
|---|---|---|
| 6,710,263 B2 | 3/2004 | Kobayashi et al. |
| 7,358,445 B1 | 4/2008 | Mohri et al. |
| 7,691,469 B2 | 4/2010 | Nomiya |
| 8,609,993 B2 | 12/2013 | Kuromitsu et al. |
| 9,517,532 B2 | 12/2016 | Kobayashi et al. |
| 11,246,215 B2 | 2/2022 | Asai et al. |
| 2003/0034554 A1 | 2/2003 | Onitani et al. |
| 2003/0062111 A1 | 4/2003 | Moriya |
| 2016/0207148 A1 | 7/2016 | Kobayashi et al. |
| 2017/0114255 A1 | 4/2017 | Aoki et al. |

FOREIGN PATENT DOCUMENTS

| | | |
|---|---|---|
| JP | H10-083938 A | 3/1998 |
| JP | H10-256731 A | 9/1998 |
| JP | H11-268968 A | 10/1999 |
| JP | 2003-110238 A | 4/2003 |
| JP | 2005-183430 A | 7/2005 |
| JP | 2005-197354 A | 7/2005 |
| JP | 2014-107525 A | 6/2014 |

OTHER PUBLICATIONS

Written Opinion for PCT/JP2017/027723 dated Oct. 24, 2017.
Japanese Office action for 2018-535553 dated Nov. 4, 2020.
Japanese Office action for 2018-535553 dated Jul. 16, 2019.

* cited by examiner

CERAMIC SUBSTRATE AND ELECTRONIC COMPONENT-EMBEDDED MODULE

This is a continuation of U.S. application Ser. No. 16/281,269 filed on Feb. 21, 2019, which is a continuation of International Application No. PCT/JP2017/027723 filed on Jul. 31, 2017, which claims priority from Japanese Patent Application No. 2016-161717 filed on Aug. 22, 2016. The contents of these applications are incorporated herein by reference in their entireties.

BACKGROUND OF THE DISCLOSURE

Field of the Disclosure

The present disclosure relates to a ceramic substrate and an electronic component-embedded module.

Description of the Related Art

Electronic component-embedded modules, formed by a ceramic substrate, multiple electronic components mounted thereon, and sealing resin covering the electronic components, have been used as highly functional modules, for example in electronic devices (e.g., see Patent Document 1).

Patent Document 1: Japanese Unexamined Patent Application Publication No. 2005-183430

BRIEF SUMMARY OF THE DISCLOSURE

Those electronic component-embedded modules as described in Patent Document 1 are disadvantageous in that firing in the production of the ceramic substrate as an element of the module causes the glass component of the ceramic layer to fuse out and cover a surface electrode on the substrate, affecting the function of the ceramic substrate.

One proposed way to control the covering of a surface electrode with the glass component is to fire the ceramic substrate with an alumina layer on the surface of the ceramic substrate.

Firing a ceramic substrate with an alumina layer on the surface of the ceramic substrate as in the foregoing successfully limits the covering of a surface electrode with the glass component. However, an electronic component-embedded module the inventors fabricated using such a ceramic substrate was found to have the disadvantage of low adhesiveness between the ceramic substrate and sealing resin.

In order to solve the above problem, the present disclosure is intended to provide a ceramic substrate with controlled covering of a surface electrode with a glass component and high adhesiveness to sealing resin in an electronic component-embedded module, and also to provide an electronic component-embedded module including this ceramic substrate.

A ceramic substrate of the present disclosure is a ceramic substrate including a ceramic body having a ceramic layer on the surface thereof and a surface electrode placed on a primary face of the ceramic body. Between the surface electrode and the ceramic layer is an oxide layer made of an insulating oxide having a melting point higher than the firing temperature for the ceramic layer. The oxide layer also extends on the ceramic layer not occupied by the surface electrode. The oxide layer on the ceramic layer not occupied by the surface electrode has a rough surface.

This ceramic substrate has an oxide layer made of an insulating oxide between a surface electrode and a ceramic layer. The oxide forming the oxide layer has a melting point higher than the firing temperature for the ceramic layer and, therefore, does not melt while the ceramic layer is being fired. Any glass component that fuses out of the ceramic layer during firing is therefore confined between the grains in the oxide layer, limiting the covering of the surface electrode with a glass component (hereinafter also referred to as wetting with glass).

The oxide layer also extends on the ceramic layer not occupied by the surface electrode. However, the oxide layer on the ceramic layer not occupied by the surface electrode has a rough surface, not smooth. The ceramic substrate has therefore a superior adhesion to the sealing resin, which is used when an electronic component-embedded module is fabricated.

In an embodiment, the surface roughness of the oxide layer on the ceramic layer not occupied by the surface electrode is larger than that of the oxide layer between the surface electrode and the ceramic layer. Such an arrangement provides an electronic component-embedded module having a superior adhesion to the sealing resin.

This ceramic substrate can be produced by, for example, forming the oxide layer on the entire surface of the ceramic layer, forming the surface electrode on part of the oxide layer, and then roughening the surface of the oxide on the ceramic layer not occupied by the surface electrode.

In an embodiment, the oxide layer between the surface electrode and the ceramic layer also has a rough surface. Such an arrangement provides an electronic component-embedded module having a superior adhesion to the sealing resin.

This ceramic substrate can be produced by, for example, forming the oxide layer on the entire surface of the ceramic layer with large-diameter oxide particles in the oxide layer and then forming the surface electrode on a part of the oxide layer.

A ceramic substrate of the present disclosure is a ceramic substrate including a ceramic body having a ceramic layer on the surface thereof and a surface electrode placed on a primary face of the ceramic body. Between the surface electrode and the ceramic layer is an oxide layer made of an insulating oxide having a melting point higher than the firing temperature for the ceramic layer. The surface of the ceramic layer not occupied by the surface electrode is exposed.

This ceramic substrate has an oxide layer made of an insulating oxide between a surface electrode and a ceramic layer. This limits the covering of the surface electrode with a glass component.

On the ceramic layer not occupied by the surface electrode, the oxide layer is not present, and the surface of the ceramic layer is exposed. The ceramic substrate has therefore a superior adhesion to the sealing resin, which is used when an electronic component-embedded module is fabricated.

In the ceramic substrate of the present disclosure, the oxide layer is preferably an alumina layer.

The ceramic layer usually contains alumina in many cases. In such a case, any reaction between the alumina layer and the ceramic layer during firing only produces compounds that can be formed inside the ceramic layer. The reaction therefore produces no extraneous compound. Hence, it is unlikely that such a reaction affects the quality of the ceramic substrate.

An electronic component-embedded module of the present disclosure includes a ceramic substrate of the present disclosure, an electronic component mounted on the surface electrode of the ceramic substrate, and sealing resin placed on a primary face of the ceramic substrate to cover the electronic component.

As stated above, the ceramic substrate of the present disclosure has a superior adhesion to the sealing resin. The sealing resin therefore does not easily come off the ceramic substrate even if a transverse force (parallel to the primary faces of the ceramic substrate) is applied to the electronic component-embedded module.

According to the present disclosure, there is provided a ceramic substrate with controlled covering of a surface electrode with a glass component and high adhesiveness to the sealing resin in an electronic component-embedded module.

DETAILED DESCRIPTION OF THE DISCLOSURE

The following describes embodiments of the ceramic substrates and electronic component-embedded modules of the present disclosure.

The present disclosure, however, is not limited to the following configurations and can be applied with any necessary modifications within the scope of the present disclosure.

Combinations of two or more desirable configurations from separate embodiments set forth below are also encompassed in the present disclosure.

Needless to say, the embodiments presented hereinafter are illustrative, and partial replacement or combination of configurations described in different embodiments is possible. The second and later embodiments skip over anything in common with Embodiment 1 and describe only differences. In particular, similar advantages resulting from similar configurations are not mentioned one by one in each embodiment.

Embodiment 1

(Ceramic Substrate)

A ceramic substrate according to Embodiment 1 of the present disclosure includes a ceramic body having a ceramic layer on its surface and a surface electrode placed on a primary face of the ceramic body. Between the surface electrode and the ceramic layer is an oxide layer made of an insulating oxide having a melting point higher than the firing temperature for the ceramic layer.

In Embodiment 1 of the present disclosure, there is an oxide layer made of an insulating oxide having a melting point higher than the firing temperature for the ceramic layer not only between the surface electrode and the ceramic layer but also on the ceramic layer not occupied by the surface electrode. The oxide layer on the ceramic layer not occupied by the surface electrode has a rough surface, and the surface roughness of the oxide layer on the ceramic layer not occupied by the surface electrode is larger than that of the oxide layer between the surface electrode and the ceramic layer.

Figure 1:
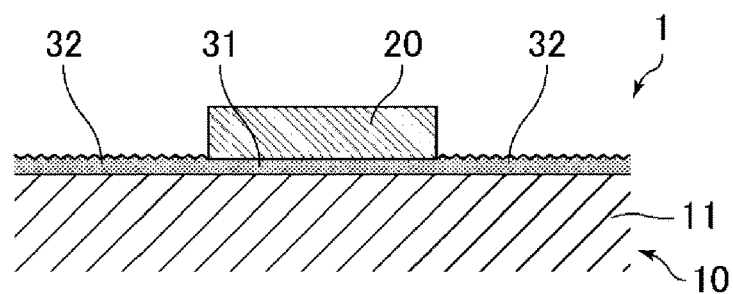
FIG. 1 is a cross-sectional diagram schematically illustrating an example of a ceramic substrate according to Embodiment 1 of the present disclosure.

FIG. 1 is a cross-sectional diagram schematically illustrating an example of a ceramic substrate according to Embodiment 1 of the present disclosure.

Although its entire structure is not illustrated in FIG. 1, the ceramic substrate 1 includes a ceramic body 10 having a ceramic layer 11 on its surface and a surface electrode 20 placed on a primary face of the ceramic body 10.

The ceramic substrate 1 illustrated in FIG. 1 has an oxide layer 31 between the surface electrode 20 and the ceramic layer 11, plus an oxide layer 32 on the ceramic layer 11 not occupied by the surface electrode 20. The oxide layer 32 on the ceramic layer 11 not occupied by the surface electrode 20 has a rough surface, and the surface roughness of the oxide layer 32 is larger than that of the oxide layer 31 between the surface electrode 20 and the ceramic layer 11.

Although not illustrated in FIG. 1, the ceramic body 10 has a multilayer structure in which multiple ceramic layers 11 are stacked. Inside the ceramic body 10, there are inner-layer conductors and via conductors. There may be a surface electrode on the other primary face of the ceramic body 10.

The ceramic layers forming the ceramic body preferably contain a low-temperature-sintering ceramic material. Low-temperature-sintering ceramic materials represent ceramic materials that sinter at firing temperatures of 1000° C. or lower and can be cofired with, for example, Ag or Cu.

Examples of low-temperature-sintering ceramic materials that can be contained in the ceramic layers include glass-composite low-temperature-sintering ceramic materials, produced by mixing borosilicate glass into quartz, alumina, forsterite, or a similar ceramic material; crystallized-glass low-temperature-sintering ceramic materials, made using crystallized glass of the $ZnO-MgO-Al_2O_3-SiO_2$ system; and non-glass low-temperature-sintering ceramic materials, made using a ceramic material of the $BaO-Al_2O_3-SiO_2$, $Al_2O_3-CaO-SiO_2-MgO-B_2O_3$, or a similar system. For the prevention of the formation of extraneous compounds upon the reaction with the oxide layers, it is preferred that the low-temperature-sintering ceramic material contain the oxide that forms the oxide layers, more preferably alumina.

The inner-layer conductors and via conductors, placed inside the ceramic body, contain an electrically conductive component. Examples of electrically conductive components that can be contained in the inner-layer conductors and via conductors include Au, Ag, Cu, Pt, Ta, W, Ni, Fe, Cr, Mo, Ti, Pd, Ru, and alloys based on one of these metals. The inner-layer conductors and via conductors preferably contain Au, Ag, or Cu, more preferably Ag or Cu, as the electrically conductive component. Owing to their low resistance, Au, Ag, and Cu are suitable especially in high-frequency applications.

The surface electrode, placed on a primary face of the ceramic body, is to be connected to an electronic component and contains an electrically conductive component. Examples of electrically conductive components that can be contained in the surface electrode include Au, Ag, Cu, Pt, Ta, W, Ni, Fe, Cr, Mo, Ti, Pd, Ru, and alloys based on one of these metals. The surface electrode preferably contains the same electrically conductive component as the inner-layer conductors and via conductors. Specifically, the surface electrode preferably contains Au, Ag, or Cu, more preferably Ag or Cu, as the electrically conductive component.

The surface electrode may contain components other than the electrically conductive component, but for the prevention of covering with a glass component, it is preferred that the surface electrode contain substantially no glass component.

The oxide layers, between the surface electrode and the ceramic layer and on the ceramic layer not occupied by the surface electrode, are both made of an insulating oxide that has a melting point higher than the firing temperature for the ceramic layers.

The melting point of the oxide forming the oxide layers is preferably higher than 1000° C., more preferably higher than 1800° C., even more preferably higher than 2000° C. The melting point of the oxide forming the oxide layers is preferably equal to or lower than 3000° C. Specific examples of the oxide layers include alumina layers, titania layers, zirconia layers, silica layers, and magnesia layers. Of these, alumina layers are preferred.

In Embodiment 1 of the present disclosure, a requirement is that the surface roughness of the oxide layer on the ceramic layer not occupied by the surface electrode be larger than that of the oxide layer between the surface electrode and the ceramic layer. The surface roughness of the oxide layer on the ceramic layer not occupied by the surface electrode is therefore not critical in itself, but preferably is 1 μm or more and 10 μm or less. A surface roughness in this range results in greater adhesiveness to the resin.

Here, the surface roughness represents the maximum height (Rz) as defined in JIS B 0601-2001 and is obtained with the cut-off wavelength λc=0.250 mm to remove the surface waviness component.

In Embodiment 1 of the present disclosure, the thickness of the oxide layers is not critical, but preferably is 1 μm or more and 10 μm or less. A thickness in this range will ensure the effective prevention of wetting with glass.

Here, the thickness of the oxide layers is obtained by microscopically measuring a cross-section exposed by grinding.

In Embodiment 1 of the present disclosure, the oxide layers preferably extend over the entire surface of the ceramic layer. However, the range of the oxide layers is not critical as long as they extend between the surface electrode and the ceramic layer and on the ceramic layer not occupied by the surface electrode.

The ceramic substrate 1 illustrated in FIG. 1 is preferably produced as follows.

FIGS. 2A, 2B, 2C, and 2D are cross-sectional diagrams schematically illustrating an example of a method for producing the ceramic substrate 1 illustrated in FIG. 1.

First, multiple ceramic green sheets are prepared. The ceramic green sheets are to be fired into ceramic layers.

The ceramic green sheets are sheets obtained by shaping, for example by doctor blading, a slurry containing a powder of ceramic raw material, such as a low-temperature-sintering ceramic material, an organic binder, and a solvent. The slurry may contain additives, such as a dispersant and a plasticizer.

Particular ceramic green sheets are perforated with through holes for via conductors. These through holes are filled with an electrically conductive paste conducting, for example, Ag or Cu as the electrically conductive component to form pieces of electrically conductive paste that will later become via conductors.

Using an electrically conductive paste having the same formula as the above one, layers of electrically conductive paste that will later become inner-layer conductors are formed on particular ceramic green sheets, for example by screen printing.

Figure 2A:
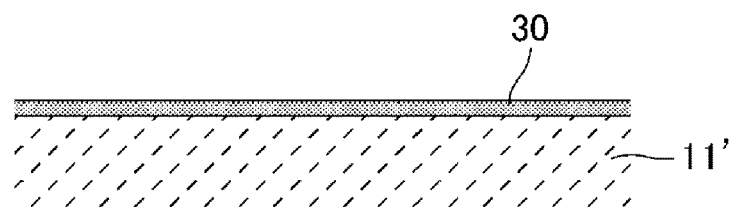
FIGS. 2A, 2B, 2C, and 2D are cross-sectional diagrams schematically illustrating an example of a method for producing the ceramic substrate 1 illustrated in FIG. 1.

Then, as illustrated in FIG. 2A, an oxide layer 30 having a smooth surface is formed on the ceramic green sheet 11' that will be positioned at the surface after stacking. In FIG. 2A, the oxide layer 30 has been formed on the entire surface of the ceramic green sheet 11'. The oxide layer 30 can be formed using a paste containing an oxide, such as alumina, for example by screen printing. The oxide layer 30 may be formed after the ceramic green sheets 11' are stacked.

For controlled covering of the surface electrode with a glass component, it is preferred that the oxide particles forming the oxide layer be densely packed. For example, it is preferred that the diameters of the oxide particles, such as alumina particles, be 0.1 μm or more and 1 μm or less.

The thickness of the oxide layer formed on the ceramic green sheet is not critical, but preferably is 1 μm or more and 10 μm or less. A thickness in this range will ensure the effective prevention of wetting with glass.

Figure 2B:
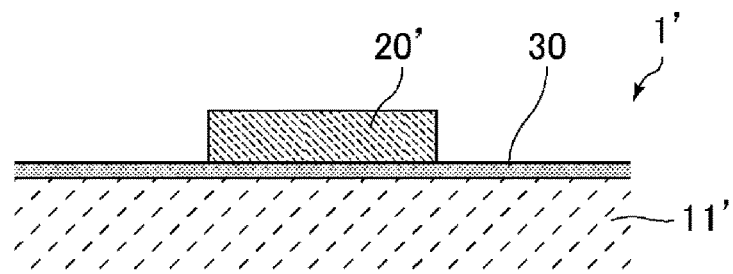

As illustrated in FIG. 2B, an electrically conductive paste layer 20' that will later become a surface electrode 20 is formed on a part of the oxide layer 30. The electrically conductive paste layer 20' can be formed by screen printing or a similar technique, for example using an electrically conductive paste having the same formula as those mentioned above. Then, the multiple ceramic green sheets 11' are stacked and pressure-bonded. In this way, an unfired multilayer body 1' is produced.

Then, the unfired multilayer body 1' is fired. This gives a multilayer body that includes, as illustrated in FIG. 2C, a ceramic body 10 having a ceramic layer 11 on its surface, an oxide layer 30 formed over the whole area of a primary face of the ceramic body 10, and a surface electrode 20 formed on the oxide layer 30.

Figure 2C:
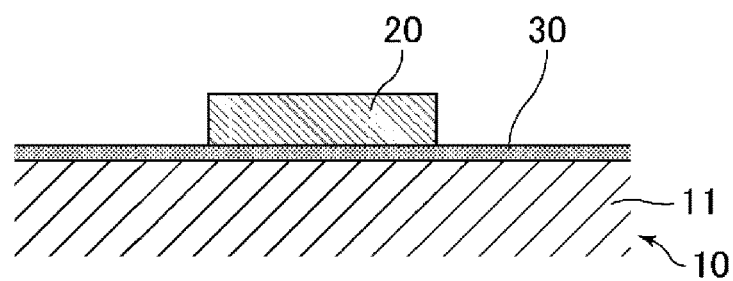

In FIG. 2C, the oxide layer 30 has been formed not only between the surface electrode 20 and the ceramic layer 11 but also on the ceramic layer 11 not occupied by the surface electrode 20, and its surface is smooth. The oxide layer 30 on the surface of the ceramic layer 11 limits the covering of the surface electrode 20 with a glass component, ensuring the electrical conductivity of the surface electrode 20.

The firing of the multilayer body may be performed using a bedding powder. Moreover, the ceramic multilayer body may be divided before or after firing.

Figure 2D:
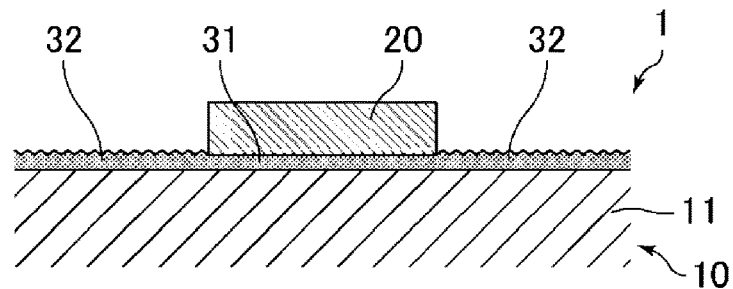

Then, the surface of the fired multilayer body is roughened. This gives, as illustrated in FIG. 2D, the oxide layer 32 on the ceramic layer 11 not occupied by the surface electrode 20 a rough surface, and the surface roughness of the oxide layer 32 on the ceramic layer 11 not occupied by the surface electrode 20 becomes larger than that of the oxide layer 31 between the surface electrode 20 and the ceramic layer 11. This leads to the improved adhesion to the sealing resin, which is used when an electronic component-embedded module is fabricated.

The method for roughening can be, for example, grinding or spraying with an abrasive. The surface of the surface electrode may be roughened unless it has negative impact on the surface electrode. Masking may optionally be performed.

In Embodiment 1 of the present disclosure, the surface roughness of the oxide layer on the ceramic layer not occupied by the surface electrode can be about 5 μm.

The fired multilayer body may be subjected to electroplating or electroless plating to form a plating layer on the top of the surface electrode.

In this way, the ceramic substrate 1 illustrated in FIG. 1 is obtained.

Note that the unfired multilayer body may be fired with a restraining green sheet, prepared beforehand and containing an oxide that is not substantially sintered at the temperature at which the ceramic green sheets are sintered, on both primary faces of the multilayer body.

In this case, the restraining green sheets do not shrink but rather help limit the shrinkage of the multilayer body in the direction parallel to the primary faces because they are not substantially sintered when fired. As a result, the size accuracy of the ceramic substrate 1 is improved.

The restraining green sheets are preferably sheets obtained by shaping, for example by doctor blading, a slurry containing a powder of an oxide of the aforementioned type, an organic binder, and a solvent. The slurry may contain additives, such as a dispersant and a plasticizer.

Examples of oxides that can be contained in the slurry include alumina, titania, zirconia, silica, and magnesia. Of these, it is preferred to use the same oxide as that forming the oxide layers, more preferably alumina.

(Electronic Component-Embedded Module)

Figure 3:
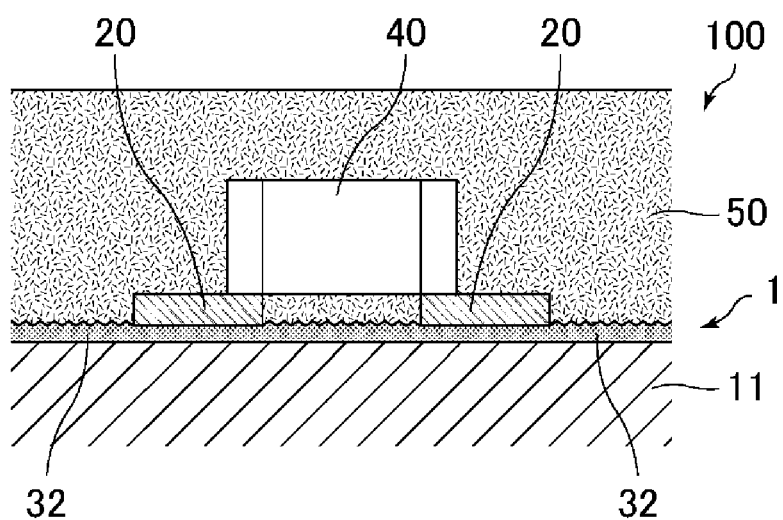
FIG. 3 is a cross-sectional diagram schematically illustrating an example of an electronic component-embedded module according to Embodiment 1 of the present disclosure.

FIG. 3 is a cross-sectional diagram schematically illustrating an example of an electronic component-embedded module according to Embodiment 1 of the present disclosure.

The electronic component-embedded module 100 illustrated in FIG. 3 includes a ceramic substrate 1, an electronic component 40 mounted on the surface electrodes 20 of the ceramic substrate 1, and sealing resin 50 placed on a primary face of the ceramic substrate 1 to cover the electronic component 40. The ceramic substrate 1 illustrated in FIG. 3 has two surface electrodes 20 but otherwise has the same structure as the ceramic substrate 1 illustrated in FIG. 1.

As stated above, the ceramic substrate 1 has a rough-surfaced oxide layer 32 on the ceramic layer 11 not occupied by the surface electrodes 20. The ceramic substrate 1 has therefore a superior adhesion to the sealing resin 50, and the sealing resin 50 does not easily come off the ceramic substrate 1 even if a transverse force (parallel to the primary faces of the ceramic substrate 1) is applied to the electronic component-embedded module 100.

The surface electrodes and the electronic component are connected by, for example, soldering. The electronic component is, for example, an active component, a passive component, or a composite thereof. Examples of active components include semiconductor devices, such as a transistor, a diode, an IC, or an LSI device. Examples of passive devises include chip components, such as a resistor, a capacitor, and an inductor, oscillators, and filters.

The sealing resin can be of any material, but examples of potential materials include curable resins, such as epoxy resin and polyimide resins.

The sealing resin is preferably placed in a half-melted state on the electronic component and then solidified or cured. Although in FIG. 3 there is some sealing resin between the ceramic substrate and the electronic component, the space between the ceramic substrate and the electronic component may be filled with the sealing resin or may be left vacant, with no sealing resin there.

Embodiment 2

(Ceramic Substrate)

As in Embodiment 1 of the present disclosure, a ceramic substrate according to Embodiment 2 of the present disclosure includes a ceramic body having a ceramic layer on its surface and a surface electrode placed on a primary face of the ceramic body. Between the surface electrode and the ceramic layer is an oxide layer made of an insulating oxide having a melting point higher than the firing temperature for the ceramic layer.

In Embodiment 2 of the present disclosure, there is an oxide layer made of an insulating oxide having a melting point higher than the firing temperature for the ceramic layer not only between the surface electrode and the ceramic layer but also on the ceramic layer not occupied by the surface electrode. The oxide layer on the ceramic layer not occupied by the surface electrode has a rough surface, and the oxide layer between the surface electrode and the ceramic layer also has a rough surface.

Figure 4:
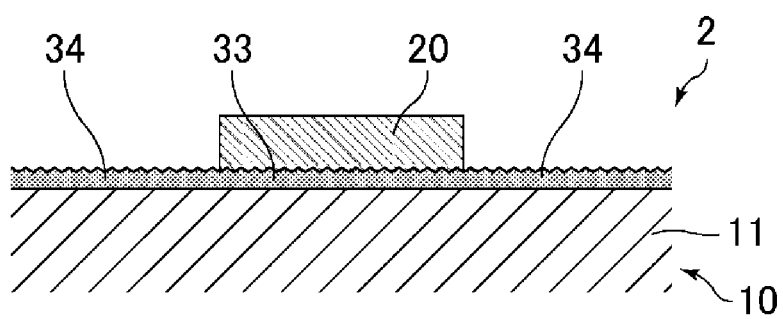
FIG. 4 is a cross-sectional diagram schematically illustrating an example of a ceramic substrate according to Embodiment 2 of the present disclosure.

FIG. 4 is a cross-sectional diagram schematically illustrating an example of a ceramic substrate according to Embodiment 2 of the present disclosure.

Although its entire structure is not illustrated in FIG. 4, the ceramic substrate 2 includes a ceramic body 10 having a ceramic layer 11 on its surface and a surface electrode 20 placed on a primary face of the ceramic body 10.

The ceramic substrate 2 illustrated in FIG. 4 has an oxide layer 33 between the surface electrode 20 and the ceramic layer 11, plus an oxide layer 34 on the ceramic layer 11 not occupied by the surface electrode 20. The oxide layer 34 on the ceramic layer 11 not occupied by the surface electrode 20 has a rough surface, and the oxide layer 33 between the surface electrode 20 and the ceramic layer 11 also has a rough surface.

The structure of the ceramic body and the surface electrode is the same as in Embodiment 1.

The oxide layers, between the surface electrode and the ceramic layer and on the ceramic layer not occupied by the surface electrode, are both made of an insulating oxide that has a melting point higher than the firing temperature for the ceramic layers.

The melting point of the oxide forming the oxide layers is preferably higher than 1000° C., more preferably higher than 1800° C., even more preferably higher than 2000° C. The melting point of the oxide forming the oxide layers is preferably equal to or lower than 3000° C. Specific examples of oxide layers include alumina layers, titania layers, zirconia layers, silica layers, and magnesia layers. Of these, alumina layers are preferred.

In Embodiment 2 of the present disclosure, a requirement is that the oxide layer on the ceramic layer not occupied by the surface electrode and the oxide layer between the surface electrode and the ceramic layer have a rough surface. The surface roughness of each oxide layer is therefore not critical in itself, but preferably is 1 µm or more and 10 µm or less. A surface roughness in this range results in greater adhesiveness to the resin. Note that the surface roughness of the oxide layer on the ceramic layer not occupied by the surface electrode may be the same as or different from that of the oxide layer between the surface electrode and the ceramic layer.

In Embodiment 2 of the present disclosure, the thickness of the oxide layers is not critical, but preferably is 1 µm or more and 10 µm or less. A thickness in this range will ensure the effective prevention of wetting with glass.

In Embodiment 2 of the present disclosure, the oxide layers preferably extend over the entire surface of the ceramic layer. However, the range of the oxide layers is not critical as long as they extend between the surface electrode and the ceramic layer and on the ceramic layer not occupied by the surface electrode.

The ceramic substrate 2 illustrated in FIG. 4 is preferably produced as follows.

Figure 5A:
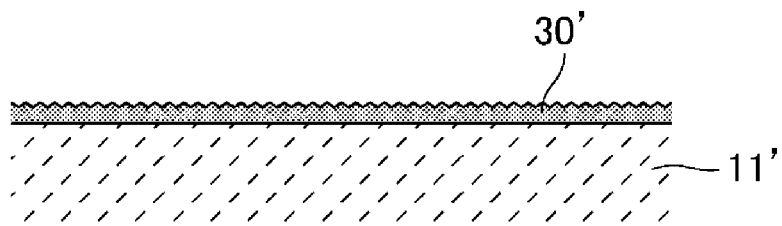
FIGS. 5A, 5B, and 5C are cross-sectional diagrams illustrating an example of a method for producing the ceramic substrate 2 illustrated in FIG. 4.
Figure 5B:
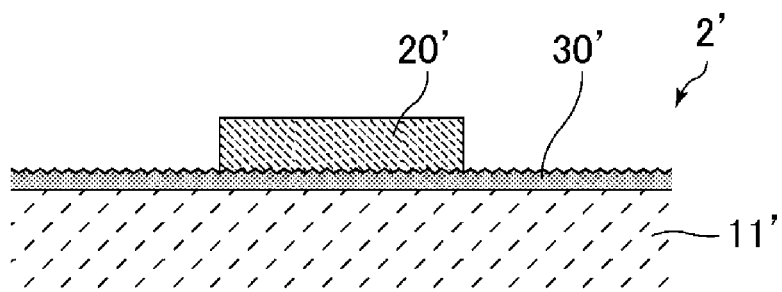
Figure 5C:
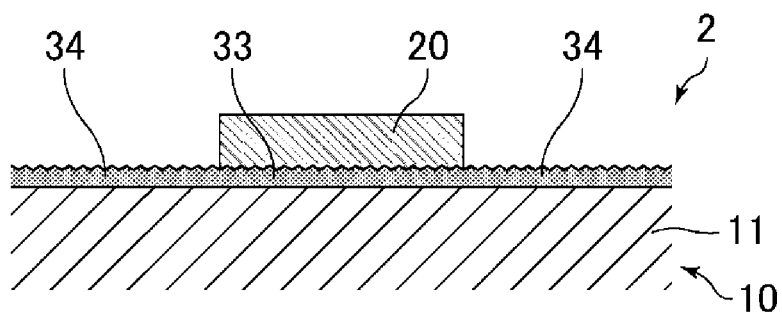

FIGS. 5A, 5B, and 5C are cross-sectional diagrams schematically illustrating an example of a method for producing the ceramic substrate 2 illustrated in FIG. 4.

First, as in Embodiment 1, multiple ceramic green sheets are prepared, and then particular ceramic green sheets have pieces of electrically conductive paste, which will later become via conductors, formed therethrough or have layers of electrically conductive paste, which will later become inner-layer conductors, formed thereon.

Then, as illustrated in FIG. 5A, an oxide layer 30' having a rough surface is formed on the ceramic green sheet 11' that will be positioned at the surface after stacking. In FIG. 5A, the oxide layer 30' has been formed on the entire surface of the ceramic green sheet 11'. The oxide layer 30' can be formed using a paste containing an oxide, such as alumina, for example by screen printing. The oxide layer 30' may be formed after the ceramic green sheets 11' are stacked.

For controlled covering of the surface electrode with a glass component, it is preferred that the oxide particles forming the oxide layer be densely packed. Incidentally, the prior addition to the paste of oxide particles larger than the thickness of the oxide layer to be formed will give the oxide layer a rough surface by leaving projections on the surface of the oxide layer after firing. For example, if an about 3-µm thick oxide layer is formed, it is preferred to add beforehand oxide particles having a diameter of 5 µm or more and 10 µm or less (larger particles) to oxide particles having a diameter of 0.1 µm or more and 1 µm or less (smaller particles). The size of the larger particles, the size of the smaller particles, the proportion of the larger to smaller particles, etc., can be adjusted according to the desired adhesiveness to sealing resin.

In Embodiment 2 of the present disclosure, the surface roughness of the oxide layer can be about 2 µm.

The thickness of the oxide layer formed on the ceramic green sheet is not critical, but preferably is 1 µm or more and 10 µm or less. A thickness in this range will ensure the effective prevention of wetting with glass.

As illustrated in FIG. 5B, an electrically conductive paste layer 20' that will later become a surface electrode 20 is formed on a part of the oxide layer 30' in a similar way as in Embodiment 1. Then, the multiple ceramic green sheets 11' are stacked and pressure-bonded. In this way, an unfired multilayer body 2' is produced.

Then, the unfired multilayer body 2' is fired. This gives a multilayer body that includes, as illustrated in FIG. 5C, a ceramic body 10 having a ceramic layer 11 on its surface, oxide layers 33, 34 formed over the whole area of a primary face of the ceramic body 10, and a surface electrode 20 formed on the oxide layer 33. Note that the oxide layers 33, 34 illustrated in FIG. 5C are the same as the oxide layer 30' illustrated in FIGS. 5A and 5B.

In FIG. 5C, not only the oxide layer 34 on the ceramic layer 11 not occupied by the surface electrode 20 but also the oxide layer 33 between the surface electrode 20 and the ceramic layer 11 has a rough surface. The oxide layers 33, 34 on the surface of the ceramic layer 11 limit the covering of the surface electrode 20 with a glass component, ensuring the electrical conductivity of the surface electrode 20. Moreover, the oxide layer 34 on the ceramic layer 11 not occupied by the surface electrode 20 has a rough surface, and this leads to the improved adhesion to the sealing resin, which is used when an electronic component-embedded module is fabricated.

The fired multilayer body may be subjected to electroplating or electroless plating to form a plating layer on the top of the surface electrode.

In this way, the ceramic substrate 2 illustrated in FIG. 4 is obtained.

Note that the unfired multilayer body may be fired with a restraining green sheet, prepared beforehand and containing an oxide that is not substantially sintered at the temperature at which the ceramic green sheets are sintered, on both primary faces of the multilayer body.

(Electronic Component-Embedded Module)

Figure 6:
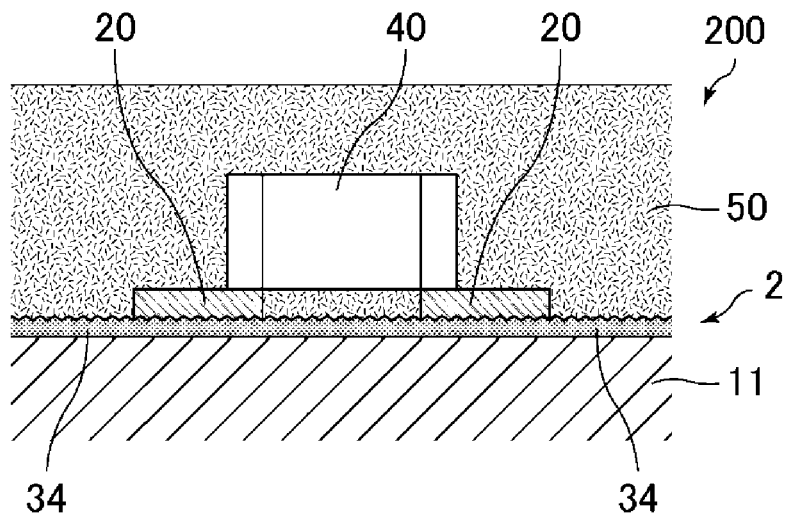
FIG. 6 is a cross-sectional diagram schematically illustrating an example of an electronic component-embedded module according to Embodiment 2 of the present disclosure.

FIG. 6 is a cross-sectional diagram schematically illustrating an example of an electronic component-embedded module according to Embodiment 2 of the present disclosure.

The electronic component-embedded module 200 illustrated in FIG. 6 includes a ceramic substrate 2, an electronic component 40 mounted on the surface electrodes 20 of the ceramic substrate 2, and sealing resin 50 placed on a primary face of the ceramic substrate 2 to cover the electronic component 40. The ceramic substrate 2 illustrated in FIG. 6 has two surface electrodes 20 but otherwise has the same structure as the ceramic substrate 2 illustrated in FIG. 4.

As stated above, the ceramic substrate 2 has a rough-surfaced oxide layer 34 on the ceramic layer 11 not occupied by the surface electrodes 20. The ceramic substrate 2 has therefore a superior adhesion to the sealing resin 50, and the sealing resin 50 does not easily come off the ceramic substrate 2 even if a transverse force (parallel to the primary faces of the ceramic substrate 2) is applied to the electronic component-embedded module 200.

Embodiment 3

(Ceramic Substrate)

As in Embodiment 1 of the present disclosure, a ceramic substrate according to Embodiment 3 of the present disclosure includes a ceramic body having a ceramic layer on its surface and a surface electrode placed on a primary face of the ceramic body. Between the surface electrode and the ceramic layer is an oxide layer made of an insulating oxide having a melting point higher than the firing temperature for the ceramic layer.

In Embodiment 3 of the present disclosure, there is no oxide layer, and therefore the surface is exposed, on the ceramic layer not occupied by the surface electrode.

Figure 7:
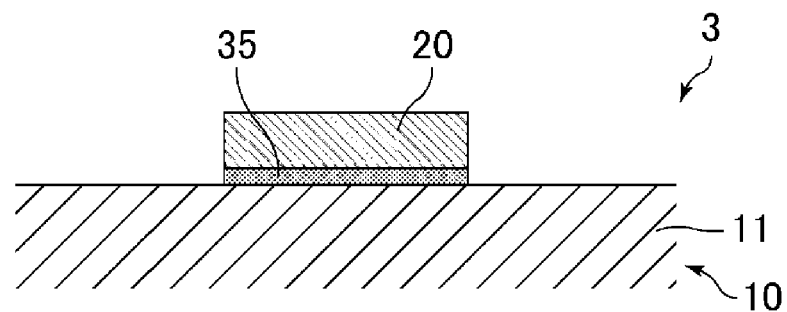
FIG. 7 is a cross-sectional diagram schematically illustrating an example of a ceramic substrate according to Embodiment 3 of the present disclosure.

FIG. 7 is a cross-sectional diagram schematically illustrating an example of a ceramic substrate according to Embodiment 3 of the present disclosure.

Although its entire structure is not illustrated in FIG. 7, the ceramic substrate 3 includes a ceramic body 10 having a ceramic layer 11 on its surface and a surface electrode 20 placed on a primary face of the ceramic body 10.

The ceramic substrate 3 illustrated in FIG. 7 has an oxide layer 35 between the surface electrode 20 and the ceramic layer 11, and the surface of the ceramic layer 11 not occupied by the surface electrode 20 is exposed.

The structure of the ceramic body and the surface electrode is the same as in Embodiment 1.

The oxide layer, between the surface electrode and the ceramic layer, is made of an insulating oxide that has a melting point higher than the firing temperature for the ceramic layers.

The melting point of the oxide forming the oxide layer is preferably higher than 1000° C., more preferably higher than 1800° C., even more preferably higher than 2000° C. The melting point of the oxide forming the oxide layer is preferably equal to or lower than 3000° C. Specific examples of oxide layers include an alumina layer, a titania layer, a zirconia layer, a silica layer, and a magnesia layer. Of these, an alumina layer is preferred.

In Embodiment 3 of the present disclosure, the thickness of the oxide layer is not critical, but preferably is 1 μm or more and 10 μm or less. A thickness in this range will ensure the effective prevention of wetting with glass.

In Embodiment 3 of the present disclosure, the size of the oxide layer is not critical as long as the oxide layer is present between the surface electrode and the ceramic layer.

The ceramic substrate 3 illustrated in FIG. 7 is preferably produced as follows.

Figure 8A:
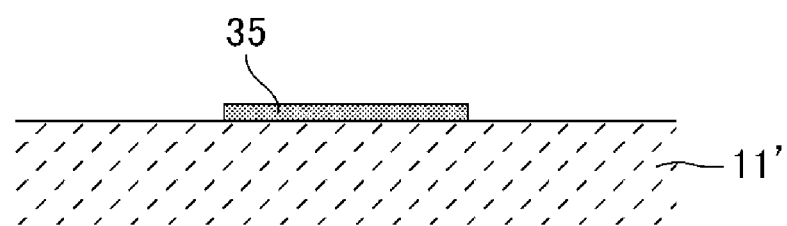
FIGS. 8A, 8B, and 8C are cross-sectional diagrams illustrating an example of a method for producing the ceramic substrate 3 illustrated in FIG. 7.
Figure 8B:
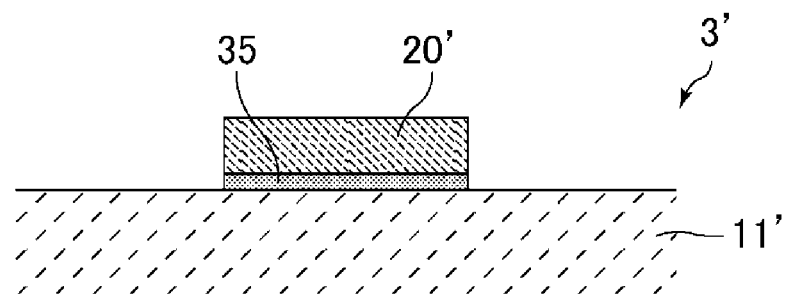
Figure 8C:
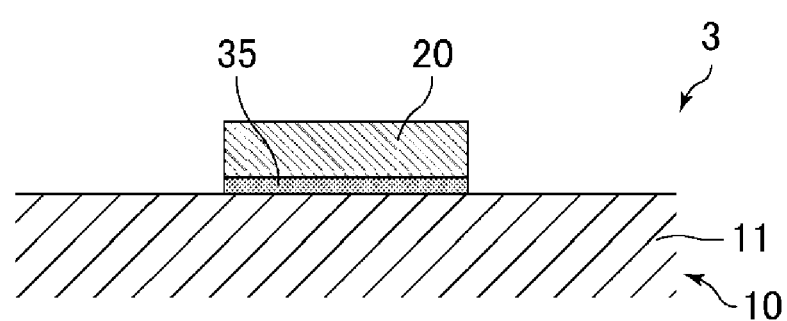

FIGS. 8A, 8B, and 8C are cross-sectional diagrams schematically illustrating an example of a method for producing the ceramic substrate 3 illustrated in FIG. 7.

First, as in Embodiment 1, multiple ceramic green sheets are prepared, and then particular ceramic green sheets have pieces of electrically conductive paste, which will later become via conductors, formed therethrough or have layers of electrically conductive paste, which will later become inner-layer conductors, formed thereon.

Then, as illustrated in FIG. 8A, an oxide layer 35 having a smooth surface is formed on the ceramic green sheet 11' that will be positioned at the surface after stacking. The oxide layer 35 can be formed using a paste containing an oxide, such as alumina, for example by screen printing. The oxide layer 35 may be formed after the ceramic green sheets 11' are stacked.

For controlled covering of the surface electrode with a glass component, it is preferred that the oxide particles forming the oxide layer be densely packed. For example, it is preferred that the diameters of the oxide particles, such as alumina particles, be 0.1 μm or more and 1 μm or less.

The thickness of the oxide layer formed on the ceramic green sheet is not critical, but preferably is 1 μm or more and 10 μm or less. A thickness in this range will ensure the effective prevention of wetting with glass.

As illustrated in FIG. 8B, an electrically conductive paste layer 20' that will later become a surface electrode 20 is formed the oxide layer 35 in a similar way as in Embodiment 1. In doing this, using the same screen as for the formation of the oxide layer 35 will ensure that the applied paste fits the oxide layer 35. Then, the multiple ceramic green sheets 11' are stacked and pressure-bonded. In this way, an unfired multilayer body 3' is produced.

Then, the unfired multilayer body 3' is fired. This gives a multilayer body that includes, as illustrated in FIG. 8C, a ceramic body 10 having a ceramic layer 11 on its surface, an oxide layer 35 formed on part of a primary face of the ceramic body 10, and a surface electrode 20 formed on the oxide layer 35.

In FIG. 8C, an oxide layer 35 has been formed between the surface electrode 20 and the ceramic layer 11, and the surface of the ceramic layer 11 not occupied by the surface electrode 20 is exposed. The oxide layer 35 on the surface of the ceramic layer 11 limits the covering of the surface electrode 20 with a glass component, ensuring the electrical conductivity of the surface electrode 20. Moreover, the exposed surface of the ceramic layer 11 not occupied by the surface electrode 20 provides the improved adhesion to the sealing resin, which is used when an electronic component-embedded module is fabricated.

The fired multilayer body may be subjected to electroplating or electroless plating to form a plating layer on the top of the surface electrode.

In this way, the ceramic substrate 3 illustrated in FIG. 7 is obtained.

Note that the unfired multilayer body may be fired with a restraining green sheet, prepared beforehand and containing an oxide that is not substantially sintered at the temperature at which the ceramic green sheets are sintered, on both primary faces of the multilayer body.

(Electronic Component-Embedded Module)

Figure 9:
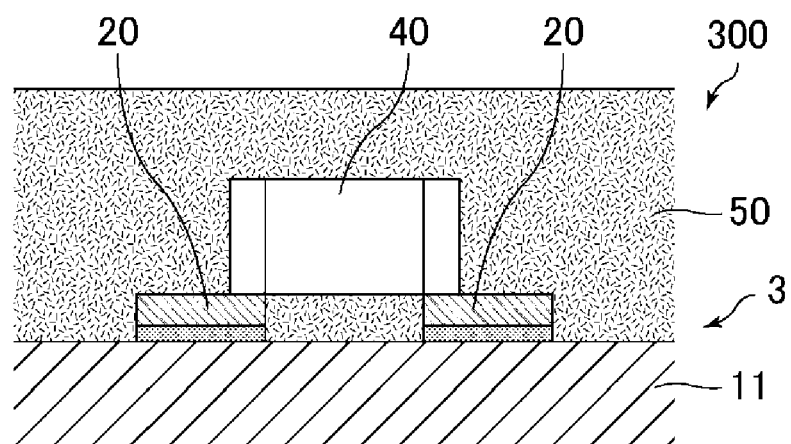
FIG. 9 is a cross-sectional diagram schematically illustrating an example of an electronic component-embedded module according to Embodiment 3 of the present disclosure.

FIG. 9 is a cross-sectional diagram schematically illustrating an example of an electronic component-embedded module according to Embodiment 3 of the present disclosure.

The electronic component-embedded module 300 illustrated in FIG. 9 includes a ceramic substrate 3, an electronic component 40 mounted on the surface electrodes 20 of the ceramic substrate 3, and sealing resin 50 placed on a primary face of the ceramic substrate 3 to cover the electronic component 40. The ceramic substrate 3 illustrated in FIG. 9 has two surface electrodes 20 but otherwise has the same structure as the ceramic substrate 3 illustrated in FIG. 7.

As stated above, the ceramic substrate 3 has an exposed surface on the ceramic layer 11 not occupied by the surface electrodes 20. The ceramic substrate 3 has therefore a superior adhesion to the sealing resin 50, and the sealing resin 50 does not easily come off the ceramic substrate 3 even if a transverse force (parallel to the primary faces of the ceramic substrate 3) is applied to the electronic component-embedded module 300.

Other Embodiments

Ceramic substrates and electronic component-embedded modules of the present disclosure are not limited to the above embodiments. Various modifications and variations are possible within the scope of the disclosure, for example for the structure of the ceramic body and the surface electrode and the method for forming the oxide layer(s).

1, 2, 3 Ceramic substrate
10 Ceramic body
11 Ceramic layer
20 Surface electrode
30, 30', 31, 32, 33, 34, 35 Oxide layer
40 Electronic component
50 Sealing resin
100, 200, 300 Electronic component-embedded module

The invention claimed is:

1. A ceramic substrate comprising:
a ceramic body having a ceramic layer on a surface thereof;
a surface electrode placed on a primary face of the ceramic body;
a first oxide layer provided between the surface electrode and the ceramic layer;
a second oxide layer provided on a portion of the ceramic layer not occupied by the surface electrode, wherein:
each of the first and second oxide layers includes an insulating oxide having a melting point higher than a firing temperature for the ceramic layer,
the second oxide layer has a rough surface,
a surface roughness of one main surface of the second oxide layer in contact with the ceramic layer is smaller than a surface roughness of the other main surface of the second oxide layer, and
a surface roughness of the other main surface of the second oxide layer is larger than a surface roughness of a surface of the first oxide layer in contact with the surface electrode, the other main surface of the second oxide layer being opposite to the one main surface of the second oxide layer and completely exposed.

2. The ceramic substrate according to claim 1, wherein each of the first and second oxide layers is an alumina layer.

3. An electronic component-embedded module comprising:
the ceramic substrate according to claim 1;
an electronic component mounted on the surface electrode of the ceramic substrate; and
a sealing resin placed on the primary face of the ceramic substrate to cover the electronic component.

* * * * *